US011075291B1

(12) United States Patent
Dainese et al.

(10) Patent No.: US 11,075,291 B1
(45) Date of Patent: Jul. 27, 2021

(54) ISOLATION STRUCTURE FOR IGBT DEVICES HAVING AN INTEGRATED DIODE

(71) Applicant: Infineon Technologies Austria AG, Villach (AT)

(72) Inventors: Matteo Dainese, Munich (DE); Canhua Li, Torrance, CA (US); Andreas Moser, Maria-Rain (AT); Wolfgang Wagner, Villach (AT)

(73) Assignees: Infineon Technologies Austria AG, Villach (AT); Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 16/844,159

(22) Filed: Apr. 9, 2020

(51) Int. Cl.
*H01L 29/739* (2006.01)
*H01L 21/762* (2006.01)
*H01L 29/06* (2006.01)
*H01L 29/10* (2006.01)
*H01L 29/08* (2006.01)
*H01L 29/40* (2006.01)
*H01L 29/66* (2006.01)

(52) U.S. Cl.
CPC .... *H01L 29/7397* (2013.01); *H01L 21/76224* (2013.01); *H01L 29/0649* (2013.01); *H01L 29/0696* (2013.01); *H01L 29/0804* (2013.01); *H01L 29/1095* (2013.01); *H01L 29/407* (2013.01); *H01L 29/66348* (2013.01)

(58) Field of Classification Search
CPC ........... H01L 21/76224; H01L 29/0649; H01L 29/7397; H01L 29/0696; H01L 29/0804; H01L 29/1095; H01L 29/407; H01L 29/66348

USPC .................................. 257/140, 135, E29.027
See application file for complete search history.

(56) References Cited

U.S. PATENT DOCUMENTS

| 6,445,048 B1 | 9/2002 | Pfirsch |
| 2012/0292662 A1* | 11/2012 | Matsuura et al. ........................... H01L 29/66348 257/139 |

FOREIGN PATENT DOCUMENTS

DE   102016125879 B3   6/2018

* cited by examiner

Primary Examiner — Thinh T Nguyen
(74) Attorney, Agent, or Firm — Murphy, Bilak & Homiller, PLLC

(57) ABSTRACT

According to an embodiment of a semiconductor device, the device includes a semiconductor substrate having a transistor region and a diode region. The transistor region includes a plurality of IGBT cells, and a charge carrier compensation region configured to expel or admit drift zone minority charge carriers based on an on-state or an off-state of the IGBT cells. The diode region includes a plurality of diode cells. An isolation structure is provided between the transistor region and the diode region. The isolation structure includes a first trench extending lengthwise along at least part of a periphery of the diode region and a second trench interposed between the first trench and the transistor region. The charge carrier compensation region extends to the second trench of the isolation structure but not the first trench such that the charge carrier compensation region is electrically isolated from an anode potential of the diode region.

20 Claims, 9 Drawing Sheets

ISOLATION STRUCTURE FOR IGBT DEVICES HAVING AN INTEGRATED DIODE

BACKGROUND

Power semiconductor devices that include a diode integrated with an insulated gate bipolar transistor (IGBT) often utilize a common metallization/polysilicon layer for providing gate potential to trench gate electrodes of the IGBT and an emitter potential to the anode region of the diode. Often there is no cell discontinuity between the trench layout in the IGBT and diode areas. Separation between border IGBT and diode cells is provided by interrupting the common metallization/polysilicon layer. This way, the common metallization/polysilicon layer provides gate potential in the IGBT area and the emitter potential in the diode area.

The IGBT area typically includes a p-doped region which protects the gate trench dielectric of the IGBT cells from excessive electric fields. The p-doped region typically continues from last cell of the IGBT and touches the first cell of the diode such that there is no discontinuity of the p-doped region between the last cell of IGBT and the first cell of the diode, or there is close proximity between the p-doped region of the last IGBT cell and the first anode region of the diode.

During the beginning of switch on of the IGBT, a neighboring trench electrode in the diode region is at emitter potential and the collector (backside) is at a higher potential. The potential in the drift zone near the diode trench is higher than zero volts. Hence, there is a risk of an inversion channel forming along the outermost trench in the diode area and which electrically connects the anode of the diode to the p-doped region of the IGBT. The p-doped region of the IGBT normally should be floating, but at the beginning of switch on of the IGBT, the p-doped region may be grounded through the inversion channel.

The input/gate capacitance of the IGBT will increase at the beginning of the switch on process if an inversion channel shorts the p-doped region of the IGBT to ground, thus requiring more time to complete the switch-on process. That is, the effective gate charge seen by the IGBT driver is higher when the p-doped region of the IGBT is shorted to ground by an inversion channel formed in the diode region than if the p-doped region remained electrically floating. The p-doped region of the IGBT is typically interconnected around the entire IGBT area so that the p-doped region is grounded everywhere which exacerbates the problem. If floating, the p-doped region would instead follow the gate potential of the IGBT. However, when the p-doped region is shorted to ground at the beginning of switch on of the IGBT, the speed at which the IGBT turns on is reduced.

Thus, there is a need for a power semiconductor device having a diode integrated with an IGBT and improved switch on response.

SUMMARY

According to an embodiment of a semiconductor device, the semiconductor device comprises: a semiconductor substrate having a transistor region and a diode region, the transistor region comprising a plurality of insulated gate bipolar transistor (IGBT) cells and a charge carrier compensation region configured to expel or admit drift zone minority charge carriers based on an on-state or an off-state of the plurality of IGBT cells, the diode region comprising a plurality of diode cells; and an isolation structure between the transistor region and the diode region, the isolation structure comprising a first trench extending lengthwise along at least part of a periphery of the diode region and a second trench interposed between the first trench and the transistor region, wherein the charge carrier compensation region extends to the second trench of the isolation structure but not the first trench such that the charge carrier compensation region is electrically isolated from an anode potential of the diode region.

According to an embodiment of a method of producing a semiconductor device, the method comprises: forming a transistor region and a diode region in a semiconductor substrate, the transistor region comprising a plurality of insulated gate bipolar transistor (IGBT) cells and a charge carrier compensation region configured to expel or admit drift zone minority charge carriers based on an on-state or an off-state of the plurality of IGBT cells, the diode region comprising a plurality of diode cells; and forming an isolation structure between the transistor region and the diode region, the isolation structure comprising a first trench extending lengthwise along at least part of a periphery of the diode region and a second trench interposed between the first trench and the transistor region, wherein the charge carrier compensation region extends to the second trench of the isolation structure but not the first trench such that the charge carrier compensation region is electrically isolated from an anode potential of the diode region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein is a power semiconductor device having improved electrical decoupling between border cells of an IGBT and border cells of a diode integrated with the IGBT, and corresponding methods of production. The IGBT includes a charge carrier compensation region configured to expel or admit drift zone minority charge carriers (holes in the case of an n-type drift zone and electrons in the case of a p-type drift zone), based on an on-state or an off-state of the IGBT. An isolation structure between the transistor region and the diode region of the semiconductor device improves electrical decoupling between IGBT and diode cells which border one another. The isolation structure includes a first trench extending lengthwise along at least part of a periphery of the diode region and a second trench interposed between the first trench and the transistor region. The charge carrier compensation region of the transistor area, which protects the gate trench dielectric of the IGBT cells from excessive electric fields, extends to the second trench of the isolation structure but not the first trench such that the charge carrier compensation region is electrically isolated from the anode potential of the diode region. Accordingly, the charge carrier compensation region of the transistor area remains electrically floating during switch on of the IGBT, thereby maintaining the designed speed at which the IGBT turns on. It is to be understood that the features of the various embodiments described herein may be combined with each other, unless specifically noted otherwise.

Figure 1:
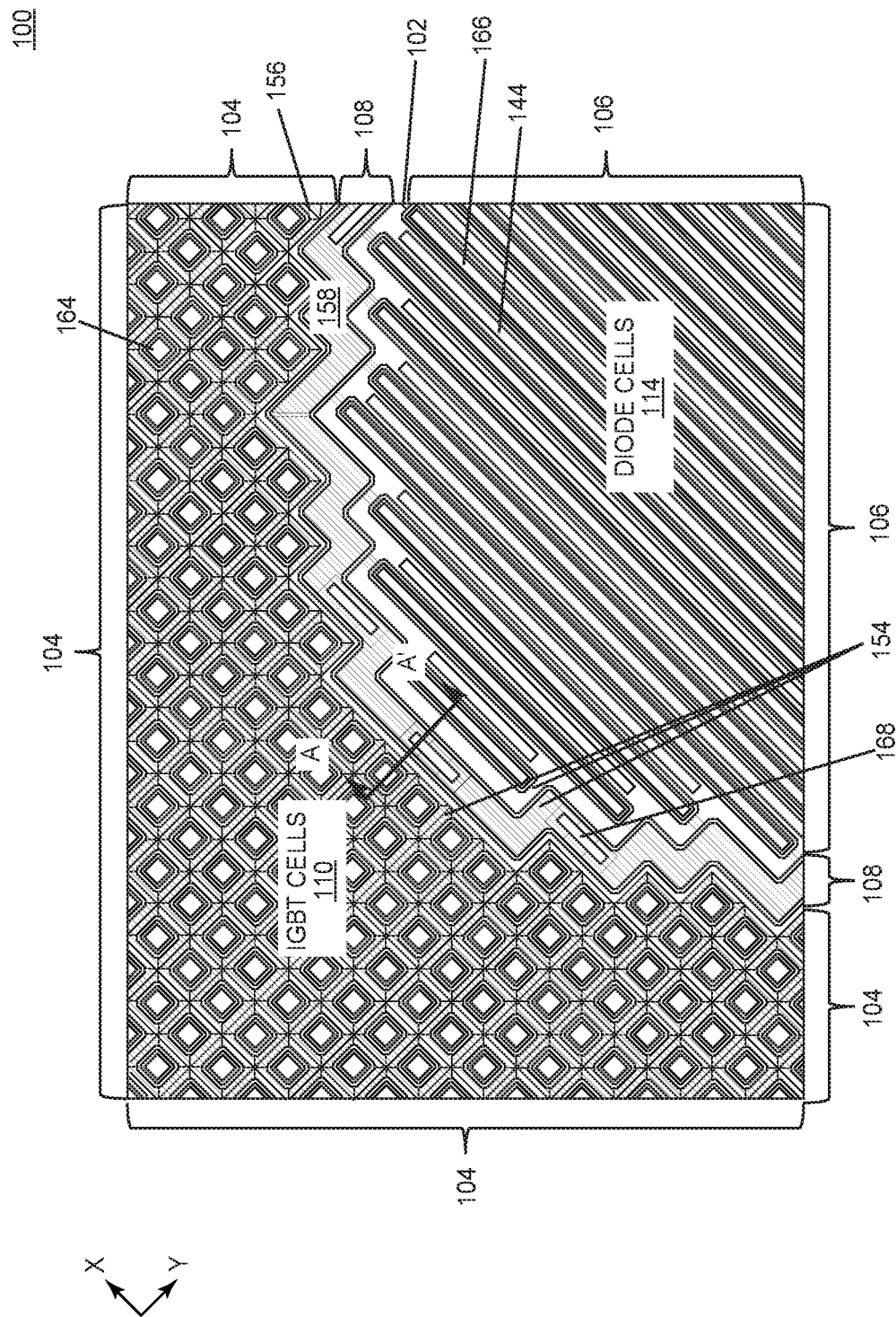
FIG. 1 illustrates a partial top plan view of an embodiment of a semiconductor device having an isolation structure which separates neighboring IGBT and diode cells.

FIG. 1 illustrates a partial top plan view of a semiconductor device 100. The semiconductor device 100 includes a semiconductor substrate 102 having a transistor region 104, a diode region 106, and an isolation region 108 separating the transistor region 104 and the diode region 106 from one another. The transistor region 104 includes a plurality of insulated gate bipolar transistor (IGBT) cells 110 and a charge carrier compensation region 112 configured to expel or admit drift zone minority charge carriers (holes in the case of an n-type drift zone and electrons in the case of a p-type drift zone), based on an on-state or an off-state of the IGBT cells 110. The diode region 106 includes a plurality of diode cells 114. In the embodiment shown in FIG. 1, the IGBT cells 110 are squared shaped and the diode cells 114 are stripe shaped. The IGBT cells 110 and the diode cells 114 may have other layouts, cell types, periodicity, etc., e.g., as described later herein.

Figure 2:
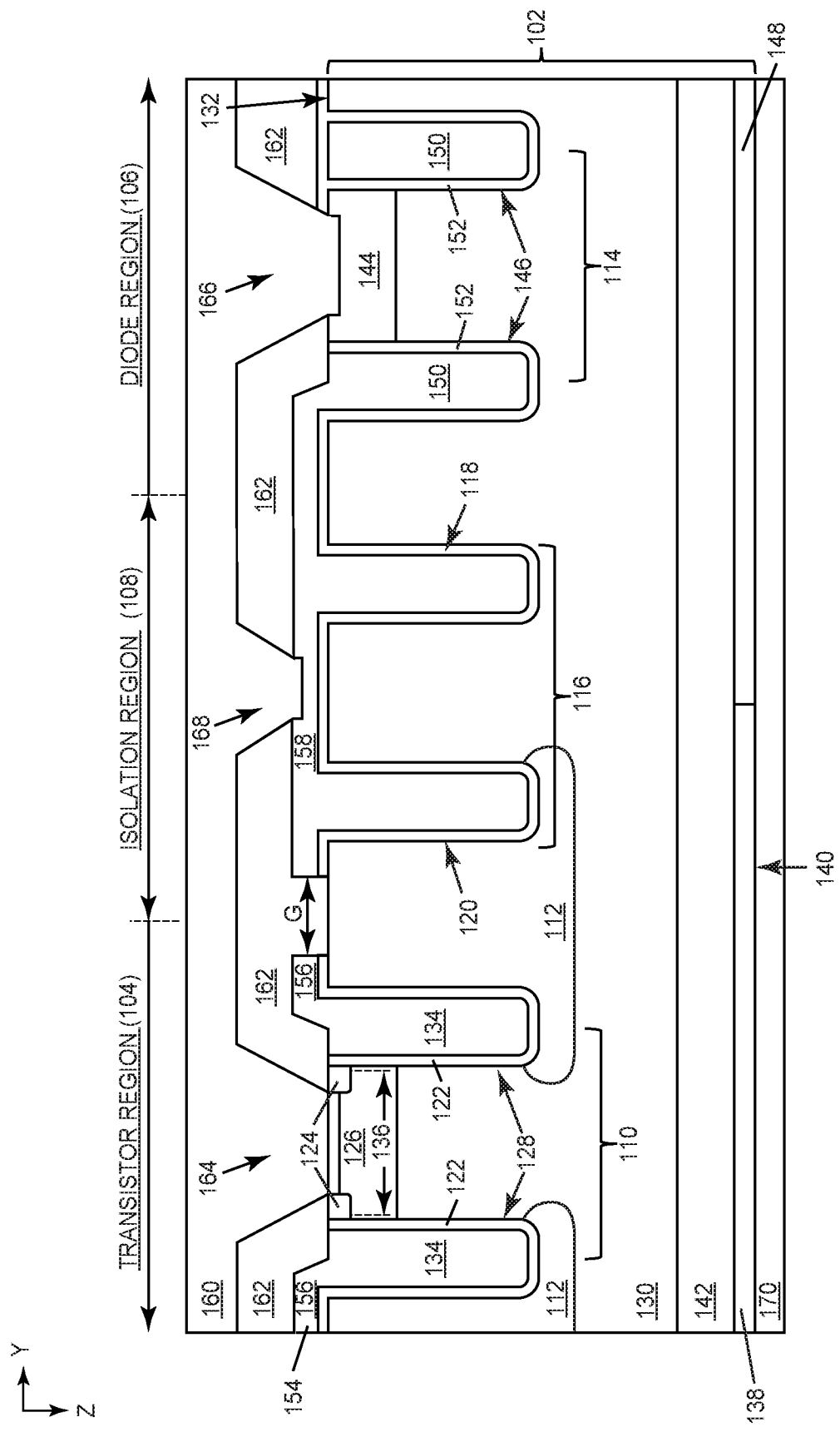
FIG. 2 illustrates a cross-sectional view of part of the semiconductor device taken along the line labelled A-A' in FIG. 1, according to an embodiment.

FIG. 2 illustrates a cross-sectional view of part of the semiconductor device 100 taken along the line labelled A-A' in FIG. 1. In the isolation region 108 which separates the transistor region 104 and the diode region 106 from one another, an isolation structure 116 is provided between the transistor region 104 and the diode region 106. The isolation structure 116 includes a first trench 118 extending lengthwise (direction 'X' in FIG. 1) along at least part of the periphery of the diode region 106. The isolation structure 116 also includes a second trench 120 interposed between the first trench 118 of the isolation structure 116 and the transistor region 104. The first and second trenches 118, 120 of the isolation structure 116 extend lengthwise (direction 'X' in FIG. 1) in parallel to one another and may laterally surround the entire perimeter of the diode region 106 or only a portion thereof, e.g., the portion adjacent the transistor region 104.

The charge carrier compensation region 112, which protects the gate trench dielectric 122 of the IGBT cells 110 from excessive electric fields, extends into the isolation region 108 to the second trench 120 of the isolation structure 116 but not the first trench 118 such that the charge carrier compensation region 112 is electrically isolated from the anode potential of the diode region 106 during anytime of the IGBT switch on process. Accordingly, even if an inversion channel 113 formed along the sidewall of the outermost field electrode trenches 146 of the diode region 106, the inversion channel would not connect to the charge carrier compensation region 112 since two trenches 118, 120 which are not part of the IGBT or diode devices are used to separate the transistor region 104 from the diode region 106. The transistor region 104 and the diode region 106 are described in more detail next.

The semiconductor substrate 102 in which the transistor region 104 and the diode region 106 are formed may include one or more of a variety of semiconductor materials that are used to form integrated circuit devices, such as but not limited to silicon (Si), silicon carbide (SiC), germanium (Ge), silicon germanium (SiGe), gallium nitride (GaN), gallium arsenide (GaAs), and the like. The semiconductor substrate 102 may be a bulk semiconductor material or may include one or more epitaxial layers grown on a bulk semiconductor material. As explained above, the IGBT cells 110 included in the transistor region 104 may be squared shaped and the diode cells 114 included in the diode region 106 may be stripe shaped as shown in FIG. 1.

Each IGBT cell 110 in the transistor region 104 includes an emitter region 124 of a first conductivity type, a body region 126 of a second conductivity type, and a gate trench 128 extending through the emitter region 124 and the body region 126 and into a drift zone 130 of the first conductivity type. The gate trenches 128 extend perpendicular (direction 'Z' in FIG. 2) to a first main surface 132 of the semiconductor substrate 102. The gate trench electrodes 128 also include a gate electrode 134 for controlling a conductive channel 136 in the body region 126 of each IGBT cell 110. The IGBT cells 110 also may include an additional trench (not shown) having a field electrode for shaping the electric field potential within the semiconductor substrate 102 during operation of the IGBT. The field electrodes may be electrically connected to a different potential than the gate electrodes 134. For example, the field electrodes may be electrically connected to emitter potential, ground, or may be electrically floating.

Still referring to the IGBT cells 110, the body region 126 separates the corresponding emitter region 124 of the IGBT cell 110 from the drift zone 130. The emitter region 124 is electrically connected to the drift zone 130 when the conductive channel 136 of the corresponding IGBT cell 110 is present. The conductive channels 136 are controlled by the voltage applied to the gate electrodes 134 of the IGBT cells 110.

The IGBT also include a collector region 138 at the opposite surface 140 of the semiconductor substrate 102 as the emitter regions 124. The emitter regions 124, the drift zone 130 and the conductive channels 136 are of a first conductivity type, and the body regions 126 and the collector region 138 are of a second conductivity type opposite the first conductivity type. For example, in the case of n-type conductive channels 136, the emitter regions 124 and the drift zone 130 are n-type and the body regions 126 and the collector region 138 are p-type. Conversely, in the case of p-type conductive channels 136, the emitter regions 124 and the drift zone 130 are p-type and the body regions 126 and the collector region 138 are n-type. An optional field stop region 142 of the first conductivity type may be formed in the semiconductor substrate 102 between the drift zone 130 and the collector region 138. The field stop region 142 may be omitted in the diode region 106 even if provided in the transistor region 104.

Now referring to the diode region 106, each diode cell 114 includes an anode region 144 of the second conductivity type and a field electrode trench 146 extending through the anode region 144 and into a cathode region 148 of the first conductivity type. The field electrode trenches 146 extend perpendicular (direction 'Z' in FIG. 2) to the first main surface 132 of the semiconductor substrate 102 and each include a field electrode 150 insulated from the surrounding semiconductor substrate 102 by an insulating layer 152 which may be the same material as the gate trench dielectric 122 or a different material.

The cell construction of the diode region 106 may be similar to that of the transistor region 104. Different, however, the emitter regions 124 are omitted from the diode region 106. Also, the diode region 106 has a cathode region 148 of the first conductivity type instead of the collector region 128 of the second conductivity type at the second main surface 140 of the semiconductor substrate 102.

The charge carrier compensation 112, like the collector region 138, is of the second conductivity type. The isolation structure 116 formed in the isolation region 108 of the semiconductor device 100 electrically isolates the charge carrier compensation region 112 from the anode region 144 of the diode cells 114 disposed along the periphery of the diode region 106.

An electrically conductive layer 154 formed above the semiconductor substrate 102 has a first part 156 and a second part 158 separated from one another. The electrically conductive layer 154 may be formed from the same material as the gate electrodes 134 in the transistor region 104 and the field electrodes 150 in the diode region 106. For example, the electrically conductive layer 154 and the trench electrodes 134, 150 may be formed from polysilicon. The electrically conductive layer 154 instead may be formed from a different material (e.g. metal) than the gate electrodes 134 in the transistor region 104 and the field electrodes 150 in the diode region 106 (e.g. polysilicon).

In each case, the first part 156 of the electrically conductive layer 154 provides a gate potential to the gate electrode 134 in the gate trenches 128 of the IGBT cells 110 and the second part 158 of the electrically conductive layer 154 provides an emitter potential to the field electrode 150 in the field electrode trenches 146 of the diode cells 114, wherein the gate potential and the emitter potential are different from one another.

As shown in FIG. 2, the first part 156 and the second part 158 of the electrically conductive layer 154 may be separated from one another between the second trench 120 of the isolation structure 116 and the gate trench 128 of outermost ones of the IGBT cells 110 which face the diode region 106 such that the second part 158 of the electrically conductive layer 154 extends over both the first trench 118 and the second trench 120 of the isolation structure 116.

Figure 3:
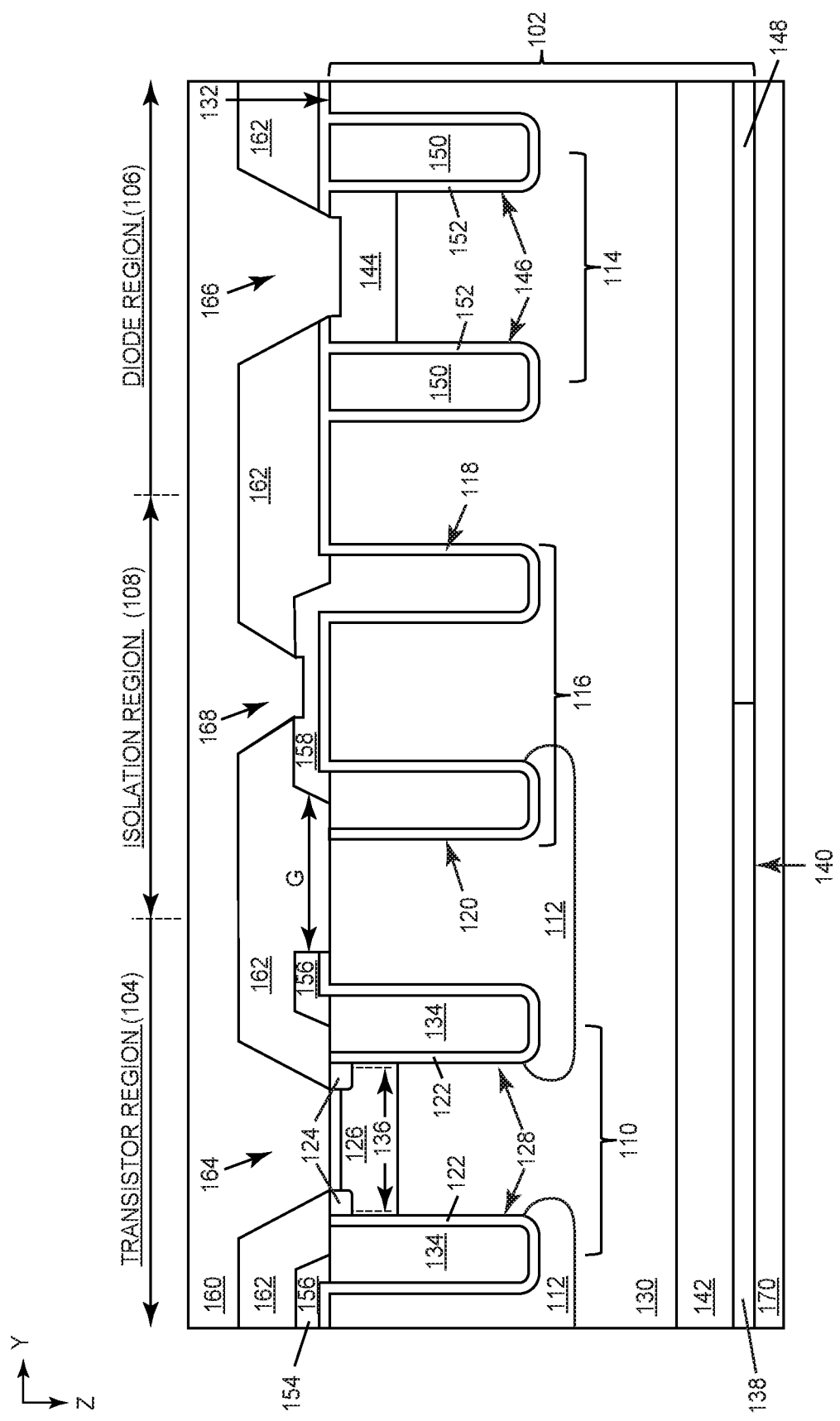
FIG. 3 illustrates a cross-sectional view of part of the semiconductor device taken along the line labelled A-A' in FIG. 1, according to another embodiment.

FIG. 3 shows the same cross-sectional view as FIG. 2, but in FIG. 3 the second part 158 of the electrically conductive layer 154 ends over the field electrode trenches 146 of outermost ones of the diode cells 114 which face the transistor region 104 such that the second part 158 of the electrically conductive layer 154 does not extend beyond the second (outer) trench 120 of the isolation structure 116.

In both FIGS. 2 and 3, above the first main surface 132 of the semiconductor substrate 102, a first metallization 160 is electrically connected to the emitter region 124 and the body region 126 of the IGBT cells 110 in the transistor region 104 and to the trench field electrode 150 and the anode region 144 of the diode cells 114 in the diode region 106. The gate electrodes 134 in the transistor region 104 are insulated from the first metallization 160 by an insulating material 162 such as a dielectric.

The first metallization 160 is electrically connected to the emitter region 124 and the body region 126 of the IGBT cells 110 in the transistor region 104 through first contact openings 164 in the insulating material 162. The first metallization 160 is electrically connected to the anode region 144 of the diode cells 114 in the diode region 106 through second contact openings 166 in the insulating material 162. The second part 158 of the electrically conductive layer 154 may be connected to the first metallization 160 through third contact openings 168 in the insulating material 162, to couple the trench field electrodes 150 in the diode region 114 to emitter potential.

The insulating material 162 may fill the lateral gap 'G' between the first and second parts 156, 158 of the electrically conductive layer 154. The contact openings 164, 166, 168 in the insulating material 162 are shown in FIG. 1 but not the insulating material 162 itself, so that underlying regions of the semiconductor device 100 are visible in FIG. 1.

A second metallization 170 contacts the collector region 138 of the IGBT and the cathode region 148 of the diode at the second main surface 140 of the semiconductor substrate 102, as shown in FIGS. 2 and 3.

During the beginning of switch on of the IGBT, the neighboring field electrode trenches 146 in the diode region 106 are at emitter potential and the collector region 138 at the backside is at a higher potential. The potential in the drift zone 130 near the field electrode trenches 146 in the diode region 106 is higher than zero volts. Hence, there is a risk of an inversion channel forming along the outermost trenches 146 in the diode region 106. However, the dual-trench isolation structure 116 separates the transistor region 104 from the diode region 106 and prevents any inversion channel in the diode region 106 from reaching the charge carrier compensation region 112 of the neighboring IGBT cells 110. Accordingly, the charge carrier compensation region 112 of the transistor region 104 remains electrically floating during the entire switch on of the IGBT.

Figure 4:
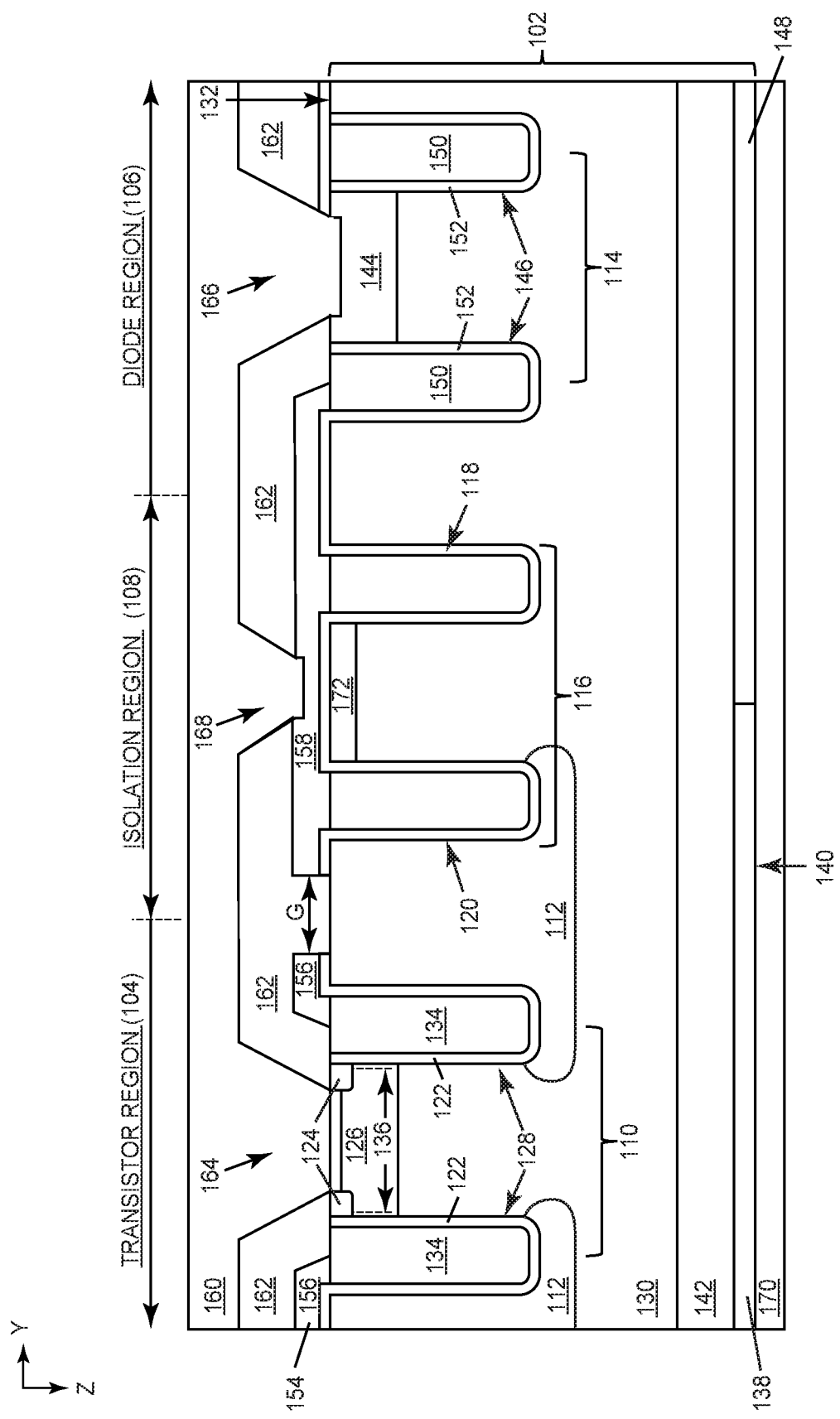
FIG. 4 illustrates a cross-sectional view of part of the semiconductor device taken along the line labelled A-A' in FIG. 1, according to another embodiment.

FIG. 4 illustrates a cross-sectional view of part of the semiconductor device 100 taken along the line labelled A-A' in FIG. 1, according to another embodiment. The embodiment shown in FIG. 4 is similar to the embodiment shown in FIG. 2. Different, however, the semiconductor device 100 further includes a doped region 172 of the first conductivity type formed in the semiconductor substrate 102 between the first trench 118 and the second trench 120 of the isolation structure 116. The doped region 172 of the first conductivity type helps to prevent formation of an inversion channel between the anode region 144 of the outermost diode cells 114 and the charge carrier compensation region 112 of the neighboring IGBT cells 110. Particularly, the doped region 172 of the first conductivity type increases the threshold voltage for an inversion channel along the second trench 120 of the isolation structure 116. The second part 158 of the electrically conductive layer 154 may also end over the field electrode trenches 146 of outermost ones of the diode cells 114 which face the transistor region 104 such that the second part 158 of the electrically conductive layer 154 does not extend beyond the second (outer) trench 120 of the isolation structure 116, as shown in FIG. 3. Described next are additional embodiments of the cell layout for the transistor and diode regions 104, 106 of the semiconductor device 100.

Figure 5:
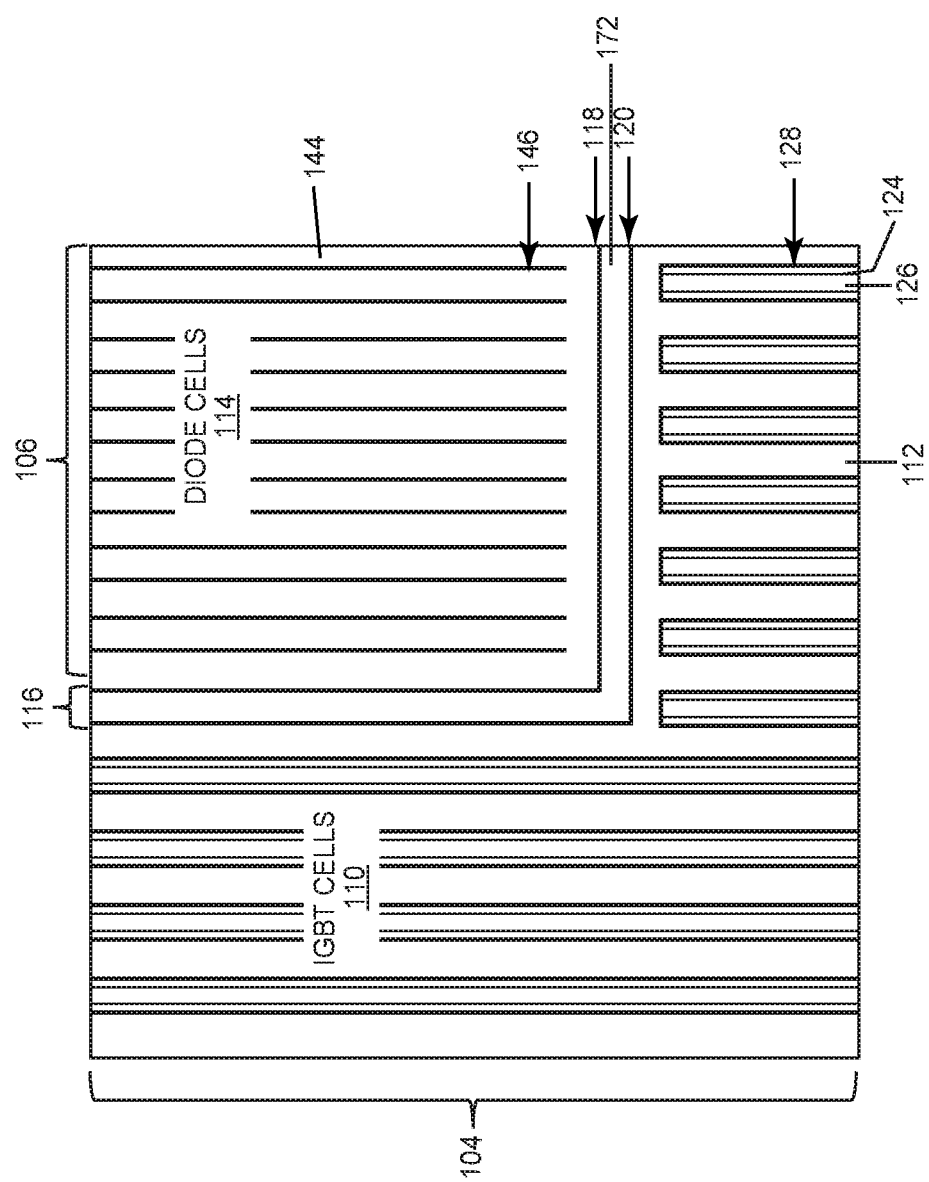
FIG. 5 illustrates a top plan view in a region where the transistor region of the semiconductor device neighbors the diode region, according to an embodiment.

FIG. 5 illustrates a top plan view in a region where the transistor region 104 neighbors the diode region 106, according to another embodiment. The electrically conductive layer 154 with the first and second separated parts 156, 158, the first metallization 160 and the insulating material 162 between the first metallization 160 and the electrically conductive layer 154 are not shown in FIG. 5 so that underlying regions are visible in FIG. 5. The field electrode trenches 146 in the diode region 106 are also illustrated in a simplified manner in FIG. 5, to enhance the illustration of other features.

In FIG. 5, the diode cells 114 are stripe shaped, e.g., rectangular to increase the area of the anode region 144. The IGBT cells 110 are also stripe shaped. While square shaped IGBT cells 110 as shown in FIG. 1 may be preferred, stripe shaped IGBT cells 110 as shown in FIG. 5 may be suitable for reverse-conducting IGBTs (RC-IGBTs).

Separately or in combination, the charge carrier compensation region 112 may or may not be continuous within the transistor region 104. For example, depending on the layout of the IGBT cells 110, the charge carrier compensation region 112 may or may not be separated between the IGBT cells 110.

Separately or in combination, the isolation structure 116 may extend lengthwise along the entire periphery of the diode region 106.

Separately or in combination, the charge carrier compensation region 112 may be contiguous throughout the transistor region 110.

Separately or in combination, the charge carrier compensation region 112 may be electrically floating.

Figure 6:
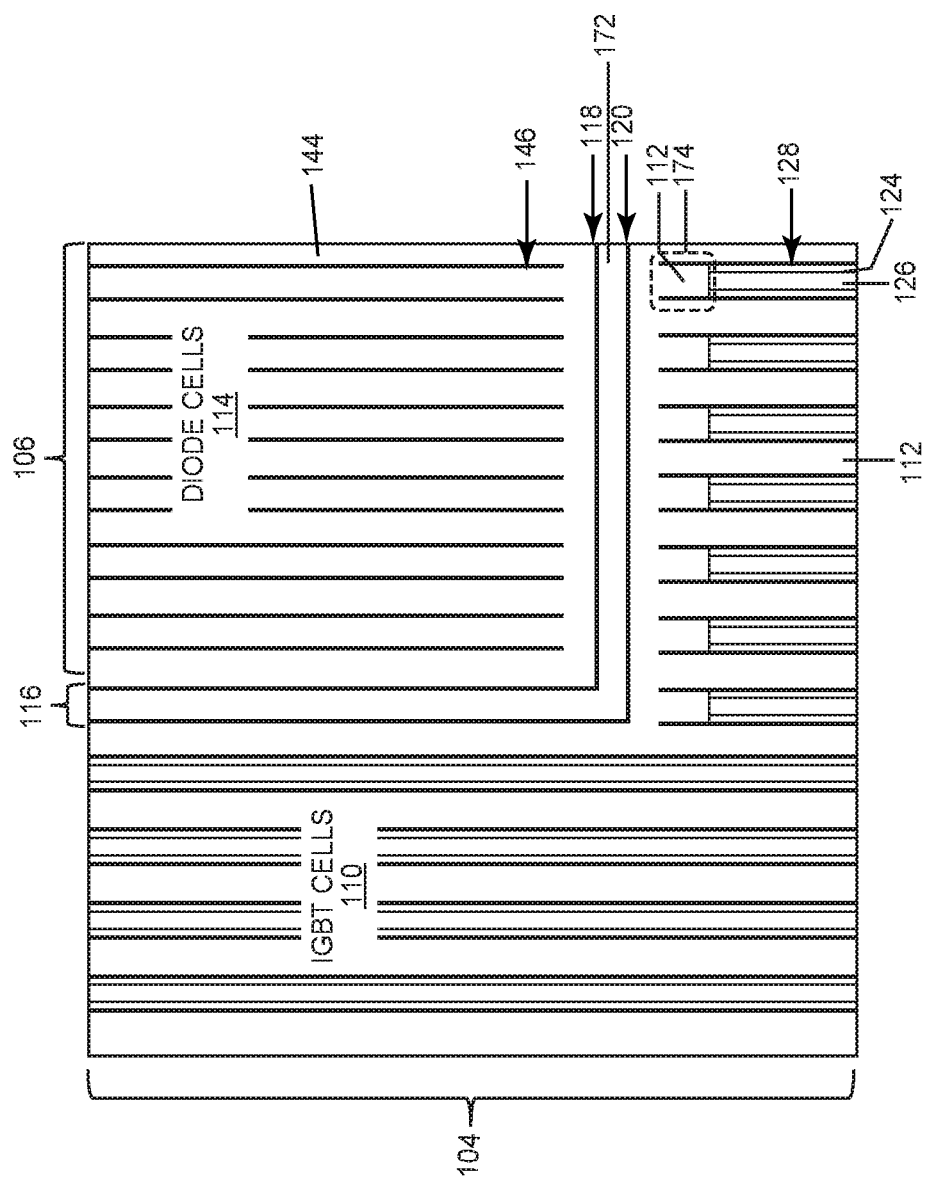
FIG. 6 illustrates a top plan view in a region where the transistor region of the semiconductor device neighbors the diode region, according to another embodiment.

FIG. 6 illustrates a top plan view in a region where the transistor region 104 neighbors the diode region 106, according to another embodiment. The embodiment shown in FIG. 6 is similar to the embodiment shown in FIG. 5. Different, however, at and the end 174 of the gate trenches 128 which face the diode region 106, the gate trenches 128 terminate closer to the diode region 106 than the emitter region 124 and the body region 126 of the IGBT cells 110. At this end 174 of the gate trenches 128, the charge carrier compensation region 112 extends from sidewall to sidewall of the gate trenches 128.

Figure 7:
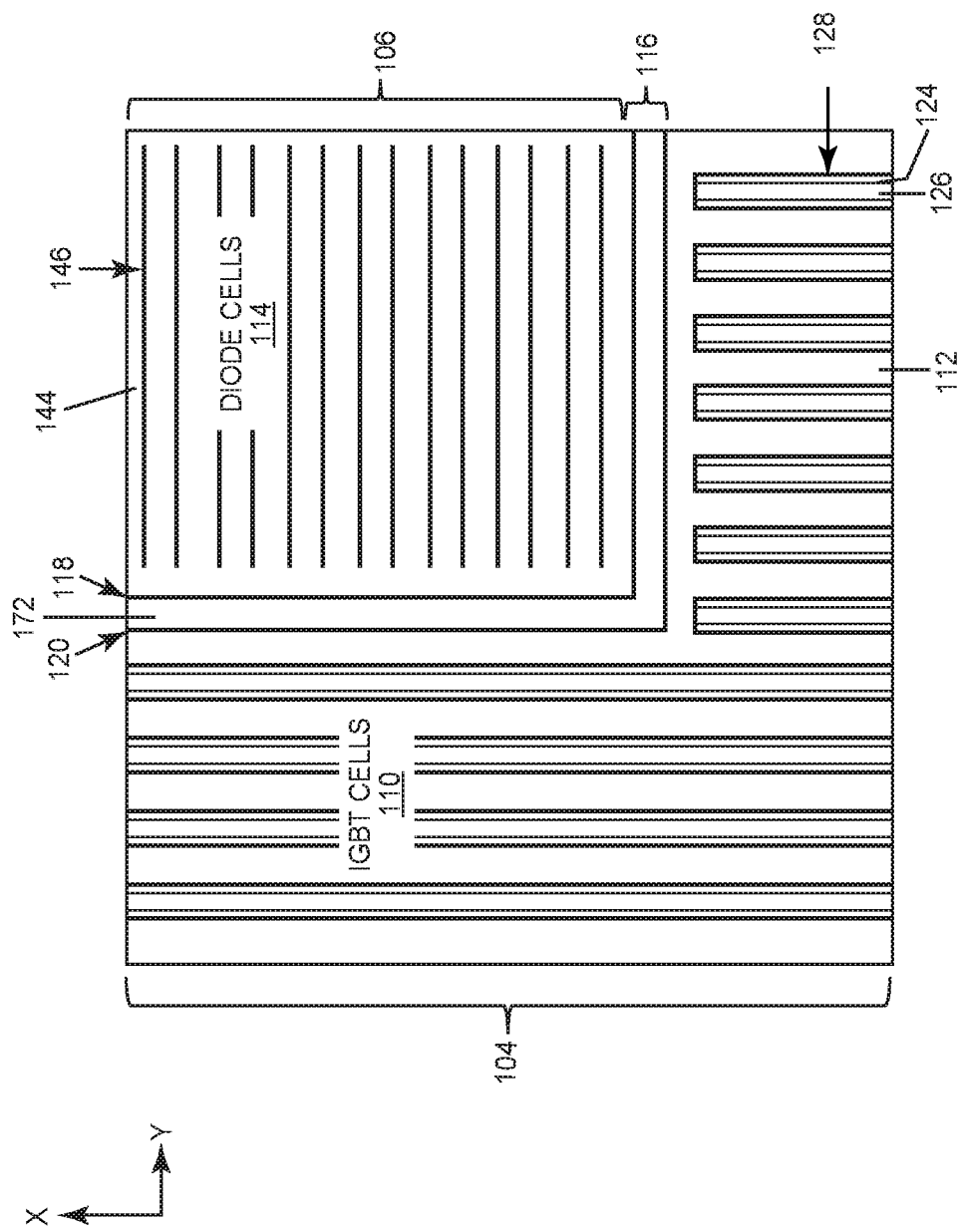
FIG. 7 illustrates a top plan view in a region where the transistor region of the semiconductor device neighbors the diode region, according to another embodiment.

FIG. 7 illustrates a top plan view in a region where the transistor region 104 neighbors the diode region 106, according to another embodiment. The embodiment shown in FIG. 7 is similar to the embodiment shown in FIG. 5. Different, however, the stripe-shaped diode cells 114 extend lengthwise (direction 'Y' in FIG. 7) transverse to the stripe-shaped IGBT cells 110. In one case, the lengthwise extension (direction 'Y' in FIG. 7) of the stripe-shaped diode cells 114 is perpendicular to the lengthwise extension (direction 'X' in FIG. 7) of the stripe-shaped IGBT cells 110.

Figure 8:
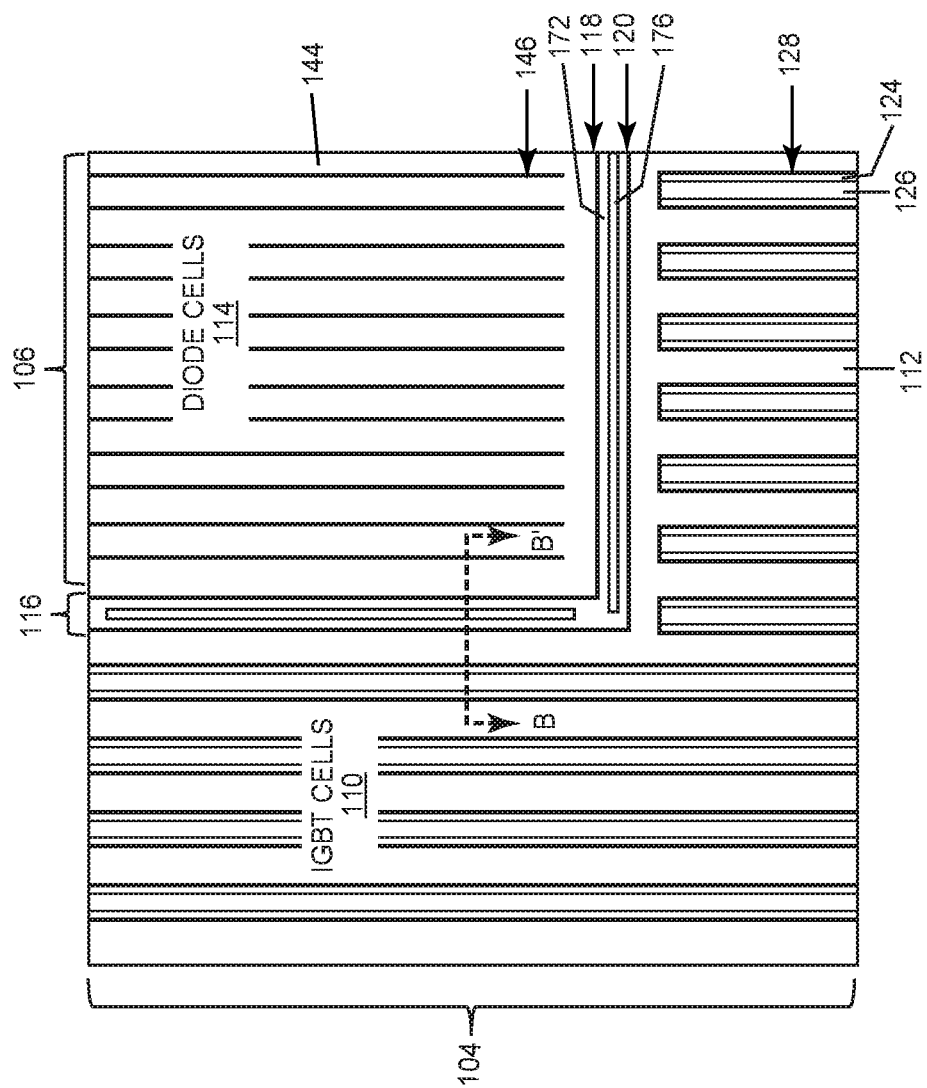
FIG. 8 illustrates a top plan view in a region where the transistor region of the semiconductor device neighbors the diode region, according to another embodiment.
Figure 9:
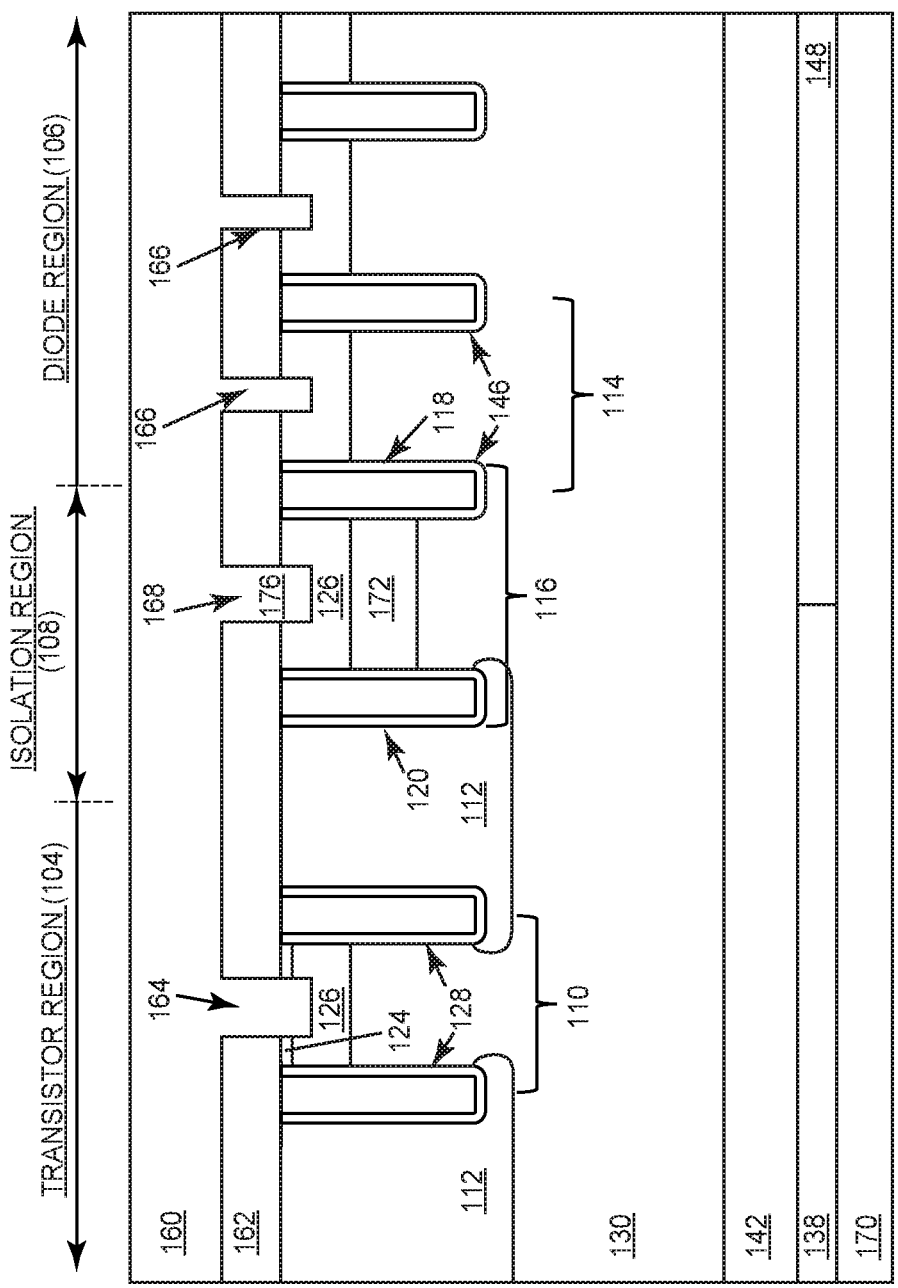
FIG. 9 illustrates a cross-sectional view of part of the semiconductor device taken along the line labelled B-B' in FIG. 8, according to an embodiment.

FIG. 8 illustrates a top plan view in a region where the transistor region 104 neighbors the diode region 106, according to another embodiment. FIG. 9 illustrates a cross-sectional view of part of the semiconductor device taken along the line labelled B-B' in FIG. 8.

The embodiment shown in FIG. 8 is similar to the embodiment shown in FIG. 5. Different, however, one or more contacts 176 may be provided to the body region 126 formed in the semiconductor substrate 102 between the first trench 118 and the second trench 120 of the isolation structure 116. As previously explained herein, the doped region 172 of the first conductivity type improves commutation ruggedness for the IGBT device, by helping to prevent formation of an inversion channel between the anode region 144 of the outermost diode cells 114 and the charge carrier compensation region 112 of the neighboring IGBT cells 110. Different from the square IGBT cell layout shown in FIG. 4, the IGBT body regions 126 laterally extend from the transistor region 104 and into the isolation region 108. The IGBT body regions 126 may also laterally extend into the diode region 106. In this case, the anode region 144 may have the same or different implant dose as the IGBT diode regions 126.

In either case, according to the embodiment shown in FIGS. 8 and 9, the doped region 172 of the first conductivity type is formed below the IGBT body region 126 in the isolation region 108 such that a pn-junction is provided therebetween to ensure blocking. One or more optional contacts 176 may be formed to connect the portion of the body region 126 located above the doped region 172 in the isolation region 108, as shown in FIGS. 8 and 9.

Although the present disclosure is not so limited, the following numbered examples demonstrate one or more aspects of the disclosure.

Example 1. A semiconductor device, comprising: a semiconductor substrate having a transistor region and a diode region, the transistor region comprising a plurality of insulated gate bipolar transistor (IGBT) cells and a charge carrier compensation region configured to expel or admit drift zone minority charge carriers based on an on-state or an off-state of the plurality of IGBT cells, the diode region comprising a plurality of diode cells; and an isolation structure between the transistor region and the diode region, the isolation structure comprising a first trench extending lengthwise along at least part of a periphery of the diode region and a second trench interposed between the first trench and the transistor region, wherein the charge carrier compensation region extends to the second trench of the isolation structure but not the first trench such that the charge carrier compensation region is electrically isolated from an anode potential of the diode region.

Example 2. The semiconductor device of example 1, wherein each IGBT cell of the plurality of IGBT cells comprises an emitter region of a first conductivity type, a body region of a second conductivity type, and a gate trench extending through the emitter region and the body region and into a drift zone of the first conductivity type, wherein each diode cell of the plurality of diode cells comprises an anode region of the second conductivity type and a field electrode trench extending through the anode region and into a cathode region of the first conductivity type, wherein the charge carrier compensation is of the second conductivity type, wherein the isolation structure electrically isolates the charge carrier compensation region from the anode region of the diode cells disposed along the periphery of the diode region.

Example 3. The semiconductor device of example 2, further comprising: an electrically conductive layer formed above the semiconductor substrate, wherein the electrically conductive layer has a first part and a second part separated from one another, wherein the first part provides a gate potential to a gate electrode in the gate trenches of the IGBT cells, wherein the second part provides an emitter potential to a field electrode in the field electrode trenches of the diode cells, wherein the gate potential and the emitter potential are different from one another, and wherein the first part and the second part of the electrically conductive layer are separated from one another between the second trench of the isolation structure and the gate trench of outermost ones of the IGBT cells which face the diode region such that the second part extends over the first trench and at least part of the second trench of the isolation structure.

Example 4. The semiconductor device of example 3, further comprising: a doped region of the first conductivity type between the first trench and the second trench of the isolation structure.

Example 5. The semiconductor device of example 4, wherein the doped region is formed below an IGBT body region.

Example 6. The semiconductor device of any of examples 1 through 5, further comprising: a doped region of the first conductivity type between the first trench and the second trench of the isolation structure.

Example 7. The semiconductor device of any of examples 1 through 6, wherein the IGBT cells are squared shaped, and wherein the diode cells are stripe shaped.

Example 8. The semiconductor device of any of examples 1 through 6, wherein the IGBT cells are stripe shaped, and wherein the diode cells are stripe shaped.

Example 9. The semiconductor device of example 8, wherein at and end of the gate trenches which face the diode region, the gate trenches terminate closer to the diode region than the emitter region and the body region of the IGBT cells, and wherein the charge carrier compensation region extends from sidewall to sidewall of the gate trenches at the end which faces the diode region.

Example 10. The semiconductor device of example 8 or 9, wherein the stripe-shaped diode cells extend lengthwise transverse to the stripe-shaped IGBT cells.

Example 11. The semiconductor device of any of examples 1 through 10, wherein the first trench and the second trench of the isolation structure extend lengthwise in parallel to one another.

Example 12. The semiconductor device of any of examples 1 through 11, wherein the isolation structure extends lengthwise along the entire periphery of the diode region.

Example 13. The semiconductor device of any of examples 1 through 12, wherein the charge carrier compensation region is contiguous throughout the transistor region.

Example 14. The semiconductor device of any of examples 1 through 13, wherein the charge carrier compensation region is electrically floating.

Example 15. A method of producing a semiconductor device, the method comprising: forming a transistor region and a diode region in a semiconductor substrate, the transistor region comprising a plurality of insulated gate bipolar transistor (IGBT) cells and a charge carrier compensation region configured to expel or admit drift zone minority charge carriers based on an on-state or an off-state of the plurality of IGBT cells, the diode region comprising a plurality of diode cells; and forming an isolation structure between the transistor region and the diode region, the isolation structure comprising a first trench extending lengthwise along at least part of a periphery of the diode region and a second trench interposed between the first trench and the transistor region, wherein the charge carrier compensation region extends to the second trench of the isolation structure but not the first trench such that the charge carrier compensation region is electrically isolated from an anode potential of the diode region.

Example 16. The method of example 15, wherein each IGBT cell of the plurality of IGBT cells comprises an emitter region of a first conductivity type, a body region of a second conductivity type, and a gate trench extending through the emitter region and the body region and into a drift zone of the first conductivity type, wherein each diode cell of the plurality of diode cells comprises an anode region of the second conductivity type and a field electrode trench extending through the anode region and into a cathode region of the first conductivity type, wherein the charge carrier compensation is of the second conductivity type, wherein the isolation structure electrically isolates the charge carrier compensation region from the anode region of the diode cells disposed along the periphery of the diode region.

Example 17. The method of example 16, further comprising: forming an electrically conductive layer above the semiconductor substrate, the electrically conductive layer having a first part and a second part, providing, via the first part of the electrically conductive layer, a gate potential to a gate electrode in the gate trenches of the IGBT cells; providing, via the second part of the electrically conductive layer, an emitter potential to a field electrode in the field electrode trenches of the diode cells, the emitter potential being different than the gate potential; and separating the first part and the second part of the electrically conductive layer between the second trench of the isolation structure and the gate trench of outermost ones of the IGBT cells which face the diode region such that the second part extends over the first trench and at least part of the second trench of the isolation structure.

Example 18. The method of example 17, further comprising: forming a doped region of the first conductivity type between the first trench and the second trench of the isolation structure.

Example 19. The method of example 18, wherein the doped region is formed below an IGBT body region.

Example 20. The method of any of examples 15 through 19, further comprising: forming a doped region of the first conductivity type between the first trench and the second trench of the isolation structure.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor substrate having a transistor region and a diode region, the transistor region comprising a plurality of insulated gate bipolar transistor (IGBT) cells and a charge carrier compensation region configured to expel or admit drift zone minority charge carriers based on an on-state or an off-state of the plurality of IGBT cells, the diode region comprising a plurality of diode cells; and
   an isolation structure between the transistor region and the diode region, the isolation structure comprising a first trench extending lengthwise along at least part of a periphery of the diode region and a second trench interposed between the first trench and the transistor region, wherein the charge carrier compensation region extends to the second trench of the isolation structure but not the first trench such that the charge carrier compensation region is electrically isolated from an anode potential of the diode region.

2. The semiconductor device of claim 1,
wherein each IGBT cell of the plurality of IGBT cells comprises an emitter region of a first conductivity type, a body region of a second conductivity type, and a gate trench extending through the emitter region and the body region and into a drift zone of the first conductivity type,
wherein each diode cell of the plurality of diode cells comprises an anode region of the second conductivity type and a field electrode trench extending through the anode region and into a cathode region of the first conductivity type,
wherein the charge carrier compensation is of the second conductivity type,
wherein the isolation structure electrically isolates the charge carrier compensation region from the anode region of the diode cells disposed along the periphery of the diode region.

3. The semiconductor device of claim 2, further comprising:
an electrically conductive layer formed above the semiconductor substrate,
wherein the electrically conductive layer has a first part and a second part separated from one another,
wherein the first part provides a gate potential to a gate electrode in the gate trenches of the IGBT cells,
wherein the second part provides an emitter potential to a field electrode in the field electrode trenches of the diode cells,
wherein the gate potential and the emitter potential are different from one another, and
wherein the first part and the second part of the electrically conductive layer are separated from one another between the second trench of the isolation structure and the gate trench of outermost ones of the IGBT cells which face the diode region such that the second part extends over the first trench and at least part of the second trench of the isolation structure.

4. The semiconductor device of claim 3, further comprising:
a doped region of the first conductivity type between the first trench and the second trench of the isolation structure.

5. The semiconductor device of claim 4, wherein the doped region is formed below an IGBT body region.

6. The semiconductor device of claim 1, further comprising:
a doped region of the first conductivity type between the first trench and the second trench of the isolation structure.

7. The semiconductor device of claim 1,
wherein the IGBT cells are squared shaped, and
wherein the diode cells are stripe shaped.

8. The semiconductor device of claim 1,
wherein the IGBT cells are stripe shaped, and
wherein the diode cells are stripe shaped.

9. The semiconductor device of claim 8,
wherein at and end of the gate trenches which face the diode region, the gate trenches terminate closer to the diode region than the emitter region and the body region of the IGBT cells, and
wherein the charge carrier compensation region extends from sidewall to sidewall of the gate trenches at the end which faces the diode region.

10. The semiconductor device of claim 8, wherein the stripe-shaped diode cells extend lengthwise transverse to the stripe-shaped IGBT cells.

11. The semiconductor device of claim 1, wherein the first trench and the second trench of the isolation structure extend lengthwise in parallel to one another.

12. The semiconductor device of claim 1, wherein the isolation structure extends lengthwise along the entire periphery of the diode region.

13. The semiconductor device of claim 1, wherein the charge carrier compensation region is contiguous throughout the transistor region.

14. The semiconductor device of claim 1, wherein the charge carrier compensation region is electrically floating.

15. A method of producing a semiconductor device, the method comprising:
forming a transistor region and a diode region in a semiconductor substrate, the transistor region comprising a plurality of insulated gate bipolar transistor (IGBT) cells and a charge carrier compensation region configured to expel or admit drift zone minority charge carriers based on an on-state or an off-state of the plurality of IGBT cells, the diode region comprising a plurality of diode cells; and
forming an isolation structure between the transistor region and the diode region, the isolation structure comprising a first trench extending lengthwise along at least part of a periphery of the diode region and a second trench interposed between the first trench and the transistor region,
wherein the charge carrier compensation region extends to the second trench of the isolation structure but not the first trench such that the charge carrier compensation region is electrically isolated from an anode potential of the diode region.

16. The method of claim 15,
wherein each IGBT cell of the plurality of IGBT cells comprises an emitter region of a first conductivity type, a body region of a second conductivity type, and a gate trench extending through the emitter region and the body region and into a drift zone of the first conductivity type,
wherein each diode cell of the plurality of diode cells comprises an anode region of the second conductivity type and a field electrode trench extending through the anode region and into a cathode region of the first conductivity type,
wherein the charge carrier compensation is of the second conductivity type,
wherein the isolation structure electrically isolates the charge carrier compensation region from the anode region of the diode cells disposed along the periphery of the diode region.

17. The method of claim 16, further comprising:
forming an electrically conductive layer above the semiconductor substrate, the electrically conductive layer having a first part and a second part,
providing, via the first part of the electrically conductive layer, a gate potential to a gate electrode in the gate trenches of the IGBT cells;
providing, via the second part of the electrically conductive layer, an emitter potential to a field electrode in the field electrode trenches of the diode cells, the emitter potential being different than the gate potential; and separating the first part and the second part of the electrically conductive layer between the second trench of the isolation structure and the gate trench of outermost ones of the IGBT cells which face the diode region such that the second part extends over the first trench and at least part of the second trench of the isolation structure.

18. The method of claim 17, further comprising:

forming a doped region of the first conductivity type between the first trench and the second trench of the isolation structure.

19. The method of claim 18, wherein the doped region is formed below an IGBT body region.

20. The method of claim 15, further comprising:

forming a doped region of the first conductivity type between the first trench and the second trench of the isolation structure.

\* \* \* \* \*